(12) United States Patent
Jaeger et al.

(10) Patent No.: US 8,435,806 B2
(45) Date of Patent: May 7, 2013

(54) METHOD FOR THE MANUFACTURE OF AN OPTOELECTRONIC COMPONENT AND AN OPTOELECTRONIC COMPONENT

(75) Inventors: Harald Jaeger, Regensburg (DE); Herbert Brunner, Sinzing (DE); Albert Schneider, Regensburg (DE); Thomas Zeiler, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 440 days.

(21) Appl. No.: 12/595,887

(22) PCT Filed: Apr. 14, 2008

(86) PCT No.: PCT/DE2008/000626
§ 371 (c)(1),
(2), (4) Date: Mar. 30, 2010

(87) PCT Pub. No.: WO2008/125096
PCT Pub. Date: Oct. 23, 2008

(65) Prior Publication Data
US 2010/0193815 A1 Aug. 5, 2010

(30) Foreign Application Priority Data
Apr. 16, 2007 (DE) .......................... 10 2007 017 855

(51) Int. Cl.
*H01L 21/00* (2006.01)
(52) U.S. Cl.
USPC ............... 438/26; 438/27; 438/28; 257/98; 257/99; 257/100; 257/E33.058

(58) Field of Classification Search .................. None
See application file for complete search history.

(56) References Cited

U.S. PATENT DOCUMENTS 6,365,979 B1 4/2002 Miyajima
6,905,643 B2 6/2005 Junker et al.
(Continued)

FOREIGN PATENT DOCUMENTS

DE 10010461 A1 9/2001
DE 10214208 A1 10/2003
(Continued)

OTHER PUBLICATIONS

Zecher, R.F., et al., "Encapsulation of Eletrical Components Utilizing Liquid Resin Molding Techniques," SPE Journal, Society of Plastic Engineers Inc., Feb. 1969, pp. 40-44, vol. 25, No. 2, Greenwich, US.
(Continued)

*Primary Examiner* — Zandra Smith
*Assistant Examiner* — Khanh Duong
(74) *Attorney, Agent, or Firm* — Slater & Matsil, L.L.P.

(57) ABSTRACT

A method is disclosed for the manufacture of an optoelectronic component. A substrate has a first primary face and a second primary face that lies opposite the first primary face. A semiconductor body that is capable of emitting electromagnetic radiation from a front side is attached to the first primary face of the substrate. A covering that is transparent to the radiation from the optoelectronic semiconductor body is applied to at least the front side of the semiconductor body. The covering is given the form of an optical element by using a closed cavity that is shaped with the contour of the optical element.

20 Claims, 9 Drawing Sheets

U.S. PATENT DOCUMENTS

| | | |
|---|---|---|
| 6,943,433 B2 | 9/2005 | Kamada |
| 7,078,732 B1 | 7/2006 | Reeh et al. |
| 7,215,010 B2 | 5/2007 | Bast et al. |
| 7,344,902 B2 * | 3/2008 | Basin et al. ............ 438/27 |
| 7,452,737 B2 | 11/2008 | Basin et al. |
| 7,621,654 B2 * | 11/2009 | Nishimoto et al. ......... 362/241 |
| 7,709,853 B2 * | 5/2010 | Medendorp, Jr. ............ 257/99 |
| 7,763,478 B2 * | 7/2010 | Loh et al. ............ 438/22 |
| 7,858,408 B2 * | 12/2010 | Mueller et al. ............ 438/27 |
| 7,977,699 B2 * | 7/2011 | Park et al. ............ 257/99 |
| 8,148,735 B2 * | 4/2012 | Horio et al. ............ 257/81 |
| 2003/0168720 A1 | 9/2003 | Kamada |
| 2003/0178747 A1 | 9/2003 | Bast et al. |
| 2004/0108614 A1 | 6/2004 | Junker et al. |
| 2006/0105484 A1 | 5/2006 | Basin et al. |
| 2008/0210962 A1 | 9/2008 | Blumel et al. |
| 2008/0213947 A1 | 9/2008 | Shimonaka et al. |
| 2008/0268559 A1 | 10/2008 | Jung |
| 2009/0212316 A1 | 8/2009 | Braune et al. |

FOREIGN PATENT DOCUMENTS

| | | |
|---|---|---|
| DE | 103 35 078 A1 | 3/2005 |
| DE | 10357818 A1 | 7/2005 |
| DE | 102005020908 A1 | 8/2006 |
| DE | 102005041064 A1 | 3/2007 |
| JP | 61283134 A | 12/1986 |
| JP | 05063239 A | 3/1993 |
| JP | 05218508 A | 8/1993 |
| JP | 07-221132 A | 8/1995 |
| JP | 08-236560 A | 9/1996 |
| JP | 11-317472 A | 11/1999 |
| JP | 2002-016093 A | 1/2002 |
| JP | 2002329892 A | 11/2002 |
| JP | 2006-027082 A | 2/2006 |
| WO | WO 97/50132 A1 | 12/1997 |
| WO | WO 2007/005013 A1 | 1/2007 |
| WO | WO 2007/007959 A1 | 1/2007 |

OTHER PUBLICATIONS

Schnitzer, I., et al., "30% External Quantum Efficiency From Surface Textured, Thin-film Light-emitting Diodes," Appl. Phys. Lett., Oct. 18, 1993, pp. 2174-2176, vol. 63 (16), American Institute of Physics, United States of America.

* cited by examiner

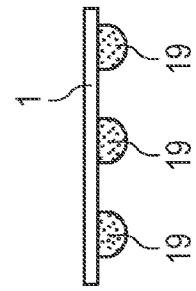
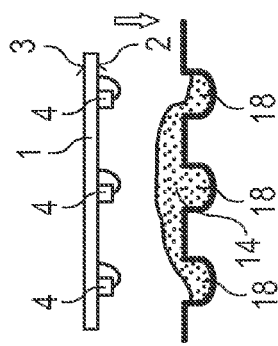
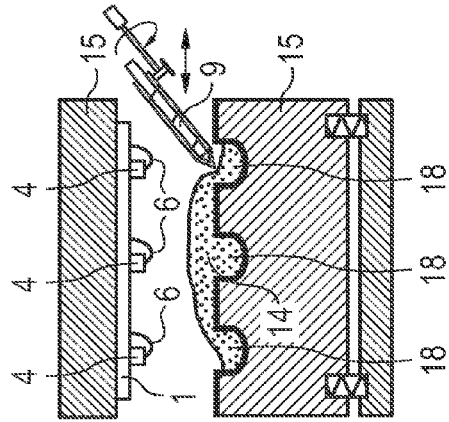
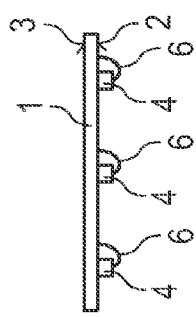
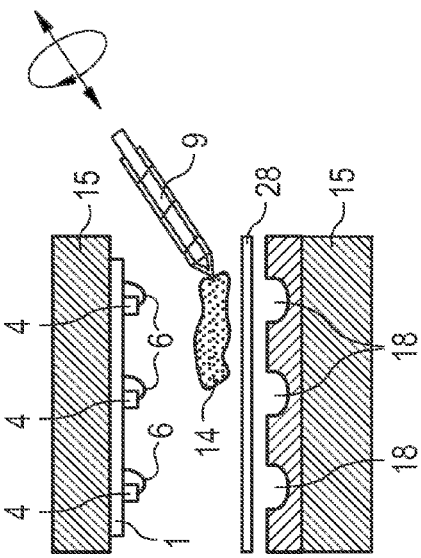

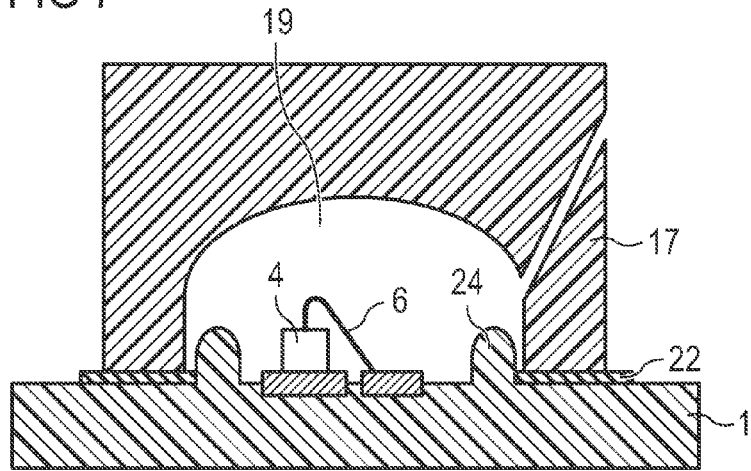
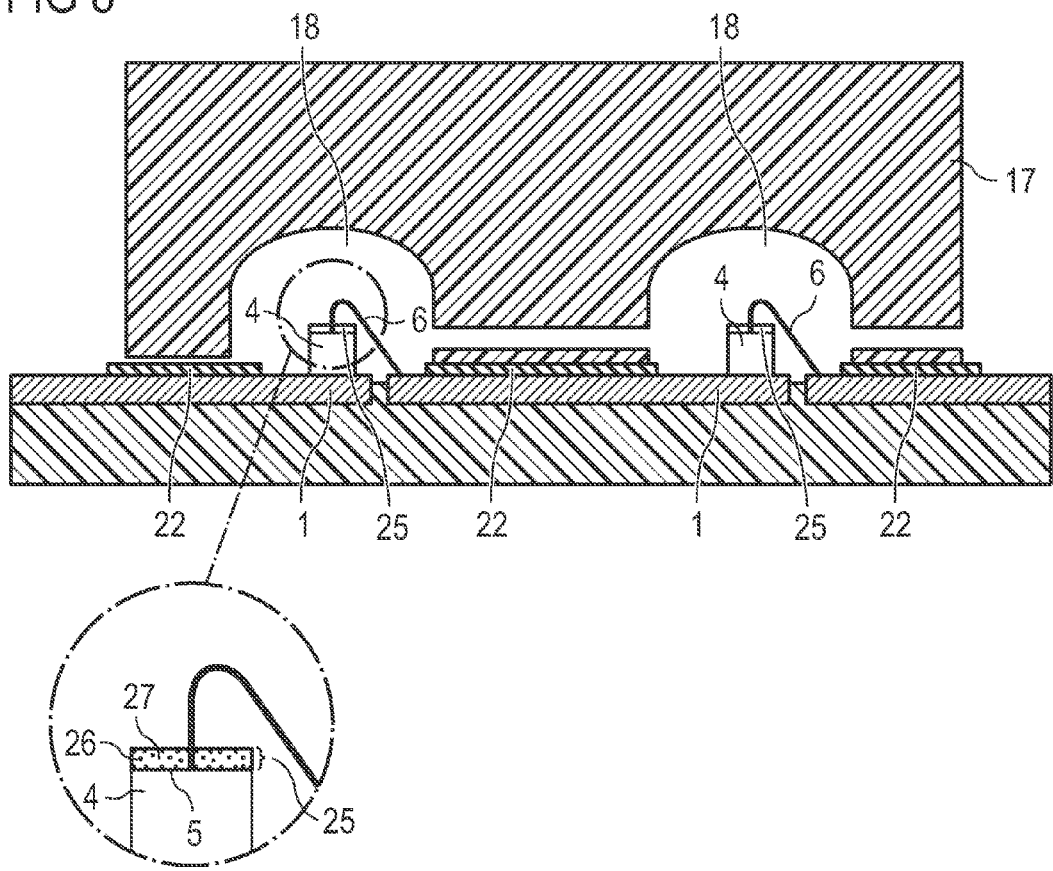

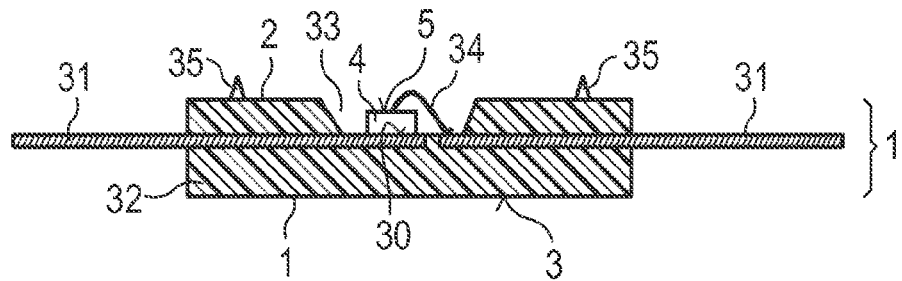
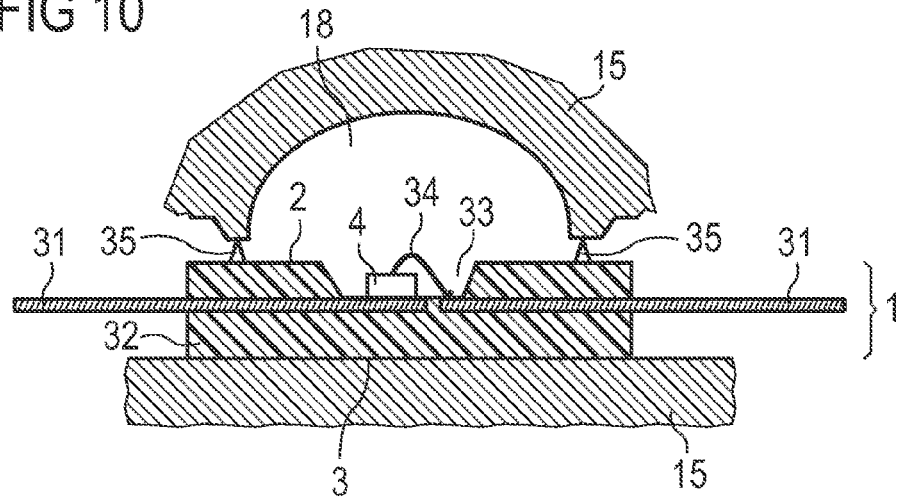
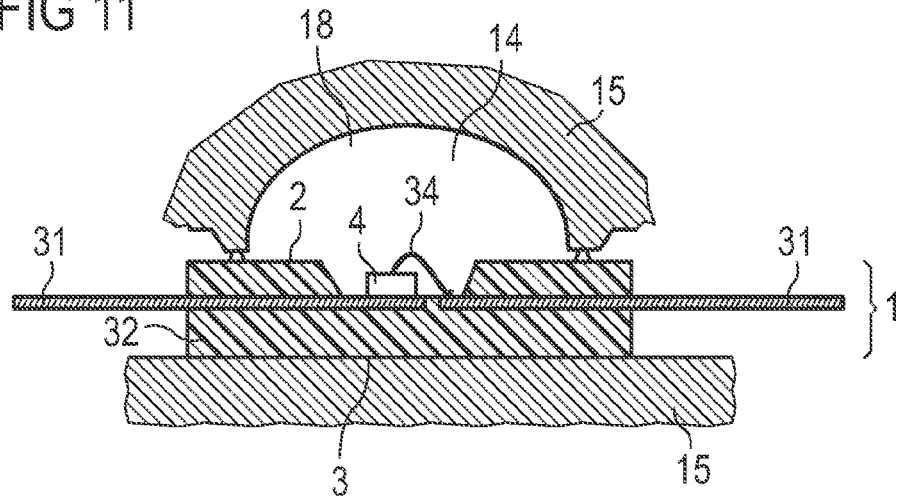

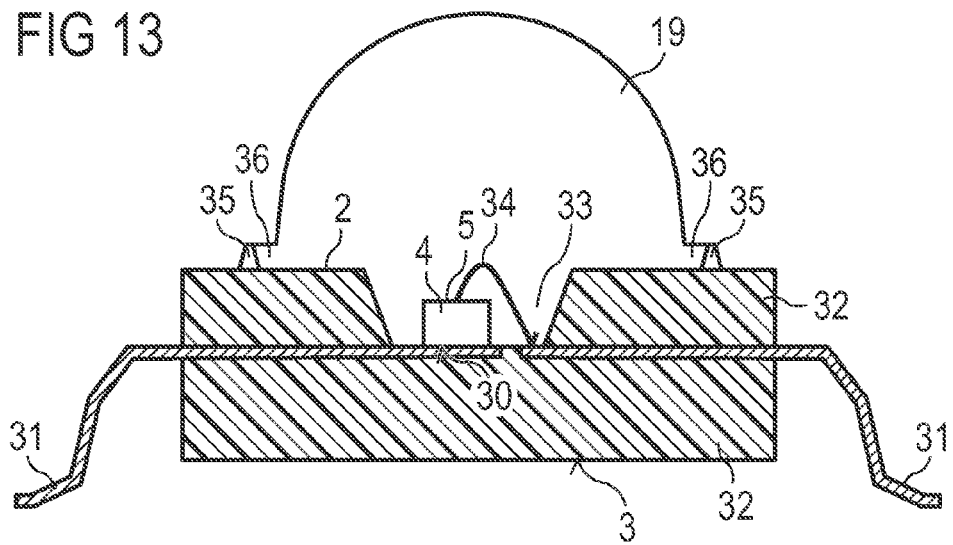
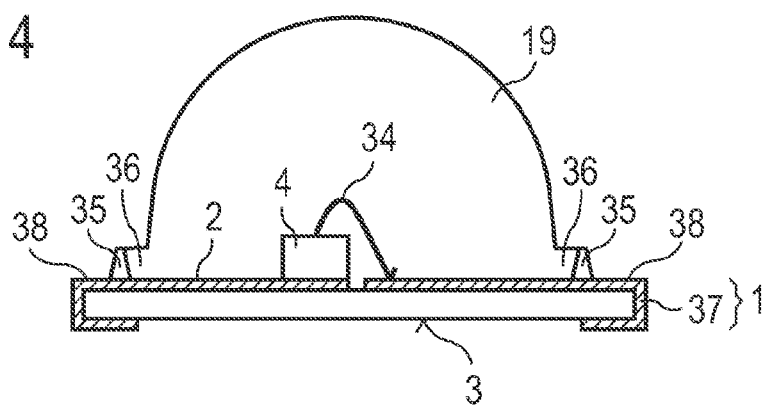
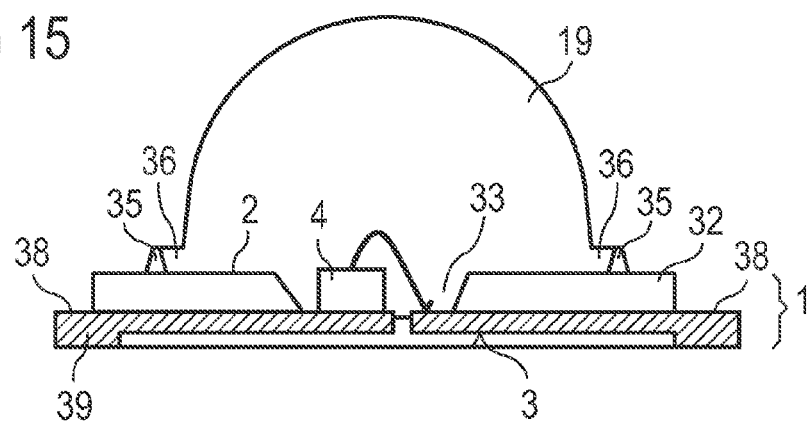

METHOD FOR THE MANUFACTURE OF AN OPTOELECTRONIC COMPONENT AND AN OPTOELECTRONIC COMPONENT

This patent application is a national phase filing under section 371 of PCT/DE2008/000626, filed Apr. 14, 2008, which claims the priority of German patent application 10 2007 017 855.9, filed Apr. 16, 2007, each of which is incorporated herein by reference in its entirety.

TECHNICAL FIELD

The invention relates to a method for the manufacture of an optoelectronic component and to an optoelectronic component.

BACKGROUND

Optical elements, such as lenses, can be used to match the radiation characteristic of optoelectronic components to specified values. An optoelectronic element of this type is, for instance, described in document DE 10 2005 020 908 A1 (U.S. equivalent Publication 2008/0210962). In this component, a prefabricated lens is placed onto a semiconductor body that generates radiation and is mounted in a housing. In order to protect the semiconductor body, it is cast into a covering before the prefabricated lens is put in place. In this optoelectronic component, the lens is manufactured separately, and is attached in an additional assembly process. This gives rise to additional assembly work and to additional potential sources of faults.

SUMMARY

In one aspect the invention provides an improved manufacturing method for an optoelectronic component. In another aspect, the invention provides an optoelectronic component with a simplified manufacturing process.

A method for the manufacture of an optoelectronic component has, in particular, the following steps:
  preparation of a substrate having a first primary face and a second primary face that lies opposite the first primary face,
  the attachment of a semiconductor body that is capable of emitting electromagnetic radiation from a front side to the first primary face of the substrate, and
  the application of a covering that is transparent or permeable to the radiation from the optoelectronic semiconductor body to at least the front side of the semiconductor body, whereby the covering is given the form of an optical element by using a tool having a closed cavity shaped with the contour of the optical element.

The optical element can, for instance, be a lens.

In this method, the covering can be positioned directly against the front side of the optoelectronic semiconductor body, or may be separated from it. In the latter case, an additional layer, a wavelength-converting layer, for instance, can be incorporated between the covering and the front side of the semiconductor body. This layer will be described in more detail further below.

It is, furthermore, also possible for the substrate to be at least partly enclosed by the covering.

The present method offers the advantage of fabricating the covering and the optical element that forms the radiation characteristic in a single process step; in other words, the optical element is integrated into the optoelectronic component rather than being manufactured separately. The manufacturing process of the optoelectronic component is simplified in this way, and the number of sources of manufacturing faults is reduced.

Favorably the covering is applied by means of a plastic processing method which, particularly favorably, is suitable for mass production. A plastic processing method that is appropriate for mass production usually permits more economical manufacture than, for instance, manual or semi-manual casting procedures. The plastic processing method can, for instance, involve compression molding, liquid injection molding (LIM), liquid transfer molding or casting.

LIM favorably permits liquid plastic materials, such as plastic materials that contain silicone, that are particularly well suited to optical elements to be injection molded in a manner appropriate for mass production.

The equipment required for LIM usually comprises at least one supply container for a liquid plastic material and a pump that transports the plastic material from the supply container to a proportioning system. A screw, a piston dispenser, a static mixer or a static-dynamic mixer may, for example, be used as the proportioning system. It is also possible for the equipment to comprise one or more additional injection molding containers in order, for instance, to process plastic materials that have two or more components. The closed cavity having the contour of the optical element is, here, usually implemented by a tool. The tool usually comprises at least two tool segments, of which at least one segment incorporates the cavity having the contour of the optical element. The substrate with the optoelectronic semiconductor body is here, for example, placed in one part of the tool, while a further part of the tool is positioned opposite to this, and incorporates the cavity that has the contour of the optical element. When the tool is closed, the cavity is also closed, either because one part of the tool closes against the substrate or against another part of the tool. The injection process, in which the plastic material is transported into the cavity, for instance through a sprue system in the tool, takes place when the cavity is closed. The proportioning system used in this plastic processing method is usually positioned parallel to one axis of the equipment. Generally speaking, the tool with the closed cavity is also located on this axis.

In the LIM system, not only single or multiple component liquid materials are processed, but also cross-linking agents such as duroplastics. The tool is usually heated for processing duroplastics. The dwell pressures used when silicone materials are processed are usually lower than those required for processing thermoplastics. A combination of LIM and thermoplastic processing is also possible.

In a further version of the method, compression molding is used as the method for processing the plastic. In compression molding, the second primary face of the substrate is clamped onto or placed into one part of the tool, while a further part of the tool, having the cavity that has the contour of the optical element, is located opposite. In contrast to the LIM method, however, the injection process here takes place while the tool is open. For this purpose the proportioning system, generally consisting of a static or static-dynamic mixer, is advantageously located at the side of the tool, and fills the cavities having the contour of the optical element directly with plastic material. When the tool is closed, the plastic material is pressed into the cavity, completely filling it.

In the case of transfer molding, the quantity of plastic material that is required to fill the cavity is measured off and put into a separate container before being introduced to the tool. The plastic material is transported from this container into the cavity when the tool is closed, using a proportioning system such as a piston. In this way liquid transfer molding processes a liquid plastic material such as a silicone material.

In one embodiment of the method, a foil is inserted into the tool, favorably before the plastic material is injected into the cavity. It is particularly favorable if the foil is directly adjacent to the cavity that incorporates the contour of the optical element. This can, for instance, be done with the aid of a vacuum. As a rule, the plastic material for the covering is brought into the cavity between the foil and the substrate. Once the covering has been formed, the tool is opened again, and the foil is usually removed.

The foil favorably prevents the plastic material from coming into contact with the tool and adhering to it. The use of the foil also has the advantage of being able to compensate for unevenness in the substrate, and thus at least reducing contamination of the substrate with plastic material. The foil is favorably between 20 µm and 100 µm thick, inclusive. The foil can, for instance, incorporate ethylene tetrafluoroethylene (ETFE), or consist of this material.

Because the tool is usually heated, a temperature-resistant foil is favorably used; particularly favorably it is resistant to temperatures between 100° C. and 150° C. inclusive.

As an alternative or in addition to a foil, adhesion of the plastic material to the tool can at least be reduced by coating the tool. The tool can thus be coated in those regions that come into contact with the plastic material. A layer incorporating or consisting of Ni-PTFE is an example of a suitable coating.

It is particularly favorable to use a silicone or hybrid material as the plastic material for the covering. Hybrid material refers here to a material that incorporates at least two primary components, whereby one of these components is a silicone. In addition to the primary components, the plastic material may also incorporate other constituents as auxiliary components, such as materials to avoid yellowing, softeners or mold release agents. Such constituents, however, generally only represent a small proportion of the mass of the plastic material. The primary components constitute the greater proportion of the plastic material.

The use of silicones for the covering offers the advantage that these materials are particularly resistant to temperature and to ultraviolet radiation, and are highly transparent to visible radiation.

A hybrid material consisting of about 50% silicone and about 50% epoxy resin (by mass) is particularly favorable.

In a further embodiment of the method, the hybrid material consists of between 10% and 70% (by mass, inclusive) epoxy resin.

The figures given above refer, of course, to the ratio of the primary components to one another; any auxiliary materials are not taken into account.

According to a further embodiment of the method, the plastic material incorporates an adhesive agent that improves adhesion between the covering and the substrate or the semiconductor body.

A prefabricated housing, a prefabricated lead frame, a prefabricated lead frame with a heat sink, or a printed circuit board (PCB) can be, for instance, used as the substrate. The substrate may, moreover, incorporate ceramic or copper, or may consist of these materials. A direct bonded copper (DBC) substrate can, for instance, be used. A DBC substrate comprises a core, consisting, for instance, of a ceramic tile, and of one or two copper sheets bonded to the core. A DBC substrate has a particularly high thermal conductivity. It is, moreover, possible to match the coefficient of thermal expansion of the DBC substrate to the coefficients of thermal expansion of a semiconductor body.

A prefabricated housing can, for instance, incorporate a lead frame with at least two connecting strips and a housing body, whereby the body of the housing is favorably formed of molding compound around the lead frame, for example, injected, pressed or transfer molded. The molding compound can, for instance, be colored, white or black, and may incorporate an epoxy resin with filler, a silicone with filler, or a hybrid material with silicone and epoxy resin, or may consist of these materials. The lead frame here favorably incorporates an anchoring point on its surface created, for instance, by etching, and providing anchorage between the lead frame and the body of the housing.

A structured, metal lead frame having at least one opening for mechanical fixing in the tool may also be used as the substrate. A structured lead frame of this type favorably has tape, such as an adhesive foil, on the second primary face in order to avoid contamination with plastic material.

In one embodiment of the method, a thin-film semiconductor chip is used as the semiconductor body. A thin-film semiconductor chip here refers to a semiconductor body incorporating an epitaxially grown sequence of semiconductor layers that generate radiation, where the substrate upon which it was grown has either been removed or thinned out to the extent that the thin-film semiconductor chip on its own no longer has adequate mechanical stability. The thin-film semiconductor chip's sequence of semiconductor layers is therefore favorably positioned on a carrier that provides mechanical stability to the semiconductor body and, particularly favorably, is different from the substrate on which the sequence of semiconductor layers in the semiconductor body were grown. It is furthermore favorable for a reflective layer to be located between the carrier and the sequence of semiconductor layers that generate the radiation; this has the purpose of directing the radiation from the sequence of semiconductor layers towards the radiating front side of the thin-film semiconductor chip. The sequence of semiconductor layers that generate the radiation, furthermore, favorably has a thickness in the range of twenty micrometers or less, particularly in the range of ten micrometers.

The fundamental principle of a thin-film semiconductor chip is described, for instance, in I. Schnitzer, et al., Appl. Phys. Lett. 63, 16, Oct. 18, 1993, pages 2174-2176, whose disclosed content is hereby incorporated through this reference. Examples of thin-film light-emitting diode chips are described in documents EP 0905797 A2 (U.S. equivalent U.S. Pat. No. 6,111,272) and WO 02/13281 A1 (U.S. equivalent U.S. Pat. No. 7,109,527), whose disclosed contents are also hereby incorporated through this reference.

A thin-film semiconductor chip is, to a good approximation, a lambertian radiation surface. For this reason it can be advantageous to add an optical element to an optoelectronic component whose radiating semiconductor body is a thin-film semiconductor chip, in order to influence the radiation characteristic of the optoelectronic component.

In a further development of the method, a wavelength-converting layer is applied to the front side of the semiconductor body. The wavelength-converting layer incorporates at least one wavelength-converting material that converts the radiation from the semiconductor body in a first range of wavelengths into radiation in a range of wavelengths that differs from the first range of wavelengths. Generally speaking, the converted radiation in the second range of wavelengths has a longer wavelength than the unconverted radiation in the first range of wavelengths.

A wavelength-converting layer is described, for instance, in document WO 97/50132 (U.S. equivalent U.S. Pat. No.

7,078,732), the disclosure content of which in this respect is hereby incorporated by reference.

The wavelength-converting material is, for instance, selected from the group consisting of the following materials: garnets doped with a rare-earth metals, alkaline earth sulphides doped with rare earth metals, thiogallates doped with rare earth metals, aluminates doped with rare earth metals, orthosilicates doped with rare earth metals, chlorosilicates doped with rare earth metals, alkaline earth silicon nitrides doped with rare earth metals, oxynitrides doped with rare earth metals and aluminum oxynitrides doped with rare earth metals.

A wavelength conversion material consisting of Ce-doped YAG (YAG:Ce) is favorably used as the wavelength conversion material.

Particles of the wavelength-converting material can be embedded in a binding agent. The binding agent can be selected from the group consisting of the following materials: thermoplastic materials, polystyrene, latex, transparent rubbers, glass, polycarbonate, acrylate, Teflon, silicate, sodium silicate, polyvinyl, silicone, epoxy resin, Polymethylmethacrylate (PMMA) or hybrid materials containing silicones, epoxy resins or PMMA.

According to one embodiment of the method, the thickness of the wavelength-converting layer, or the concentration of wavelength-converting material, is selected in such a way that a proportion of the electromagnetic radiation in the first range of wavelengths that is emitted by the semiconductor body passes unconverted through the wavelength-converting layer. In this case, the unconverted radiation in the first range of wavelengths and the converted radiation in the second range of wavelengths mix together, so that the optoelectronic component emits mixed radiation consisting of radiation in the first range of wavelengths and radiation in the second range of wavelengths. In this way it is possible to manufacture an optoelectronic component that emits mixed light whose color is located in the white region of the CIE table of standard colors. To this end a semiconductor body may, for instance, be employed that transmits electromagnetic radiation in the blue region of the spectrum, together with a wavelength-converting material that converts a proportion of this blue radiation in the first range of wavelengths into yellow radiation. An example of a wavelength-converting material suitable for this purpose is YAG:Ce.

In one particularly favorable embodiment of the method, a sealing layer is applied to the first primary face of the substrate. It is particularly favorable to apply the sealing layer to a part of the first primary face that is designed to be in contact, in the course of the process, with that part of the tool that incorporates the contour of the optical element, so that when the tool is closed, the sealing layer forms, at least partially, a common boundary surface with the tool. It is particularly favorable for the region of the first primary face of the substrate to which the optical element is applied to be free from the sealing layer. In one embodiment, the sealing layer and the optical element have a common boundary surface.

The sealing layer has the particular purpose of compensating for roughness in the substrate and thereby contributing to tighter closure of the cavity. In this way, contamination of the substrate during the processing of the plastic, such as can particularly occur when low-viscosity plastic materials such as silicone are used, can be avoided. Particularly when contamination is found in those regions of the substrate that will later be used to make contact with the optoelectronic semiconductor component, it would otherwise be necessary to remove the contamination in a separate process step. The sealing layer can, furthermore, perform the function of an adhesive agent between the plastic material and the substrate. For this purpose it is helpful if the sealing layer is applied at least partially to that region of the first primary face of the substrate to which the covering is applied. In this embodiment, the optical element and the sealing layer favorably have a common boundary surface.

Favorably the sealing layer has a soft, flexible consistency, so that it yields when the tool is closed, but is neither removed from the substrate nor damaged by the closing pressure applied. It is particularly favorable for the sealing layer to be between 5 µm and 100 µm thick, inclusive. The sealing layer, furthermore, favorably exhibits a Shore hardness between A30 and 90, inclusively again.

The sealing layer can be applied by a printing process such as screen printing, pad printing or inkjet printing.

The sealing layer can, for instance, incorporate polyimide or silicone, or can consist of one of these materials.

The sealing layer can moreover, for instance, incorporate a dry resist or may consist of this material. The sealing layer that incorporates dry resist, or that consists of this material, is advantageously applied to the first primary face of the substrate by a lithographic method.

In a further development of the method, metallization is applied to the substrate as the sealing layer. The metallization favorably incorporates one of the following materials, or consists of one of these materials: silver, gold, copper, tin. Favorably the metallization is not thicker than 30 µm.

In a further favorable embodiment of the method, the sealing layer is structured and is applied to the substrate. This favorably allows air to escape from the closed cavity. This makes it easier to fill the cavity with plastic material, and therefore improves the shaping of the cavity.

The sealing layer can, moreover, consist of a foil that is, for instance, applied to the substrate with a structure. The foil can remain in the component, or may be at least partially removed from the substrate again.

According to one embodiment, the sealing layer can incorporate an adhesive that improves adhesion between the sealing layer and the substrate.

In a further embodiment of the method, the mold core of the tool incorporates a venting duct. In this way again, advantageous venting of the closed tool can be achieved as the plastic is processed.

Furthermore, a surface in the mold core can be recessed in such a way that it, together with a surface of the substrate or of the sealing layer, creates a venting duct.

In a further development of the method, the tool, particularly the cavity that has the contour of the optical element, is evacuated prior to the injection procedure. Evacuating the tool generally advantageously results in particularly good filling of the cavities.

In a further development of the method, several semiconductor bodies that are capable of generating electromagnetic radiation are applied to the first primary face of the substrate. A covering that is transparent or permeable to the radiation from the optoelectronic semiconductor body is then applied to at least the front side of the semiconductor body, whereby the covering is given the form of an optical element by a closed cavity shaped with the contour of the optical element. The substrate is divided into separate components after the covering has been applied. This allows several optoelectronic components to be manufactured in parallel. In this way the processing time for each component is significantly shortened.

In a further development of the method, several substrates are applied to a roll (roll-to-roll process). It is, furthermore, also possible for the substrate to be located on a carrier tape that is rolled up to form a roll.

This again permits multiple components to be manufactured in parallel, whereby handling the components to be manufactured is particularly simplified through the use of a plastic processing method to apply the covering, since the roll can be passed through the plastic processing system. In this way, pick-and-place equipment for handling the components can, for instance, be omitted.

In a roll-to-roll process, a placeholder is favorably attached to the roll. In this way it is possible to avoid damaging the semiconductor body or its electrical contacts during processing.

In a further development of the method according to the invention, the substrate has at least one raised region on its first primary face, favorably having the shape of a dome. The raised region is particularly favorably located in the area of the first primary face of the substrate to which the covering is applied. This raised region permits better anchorage between the substrate and the covering to be achieved.

Furthermore, the substrate can incorporate a structure on its first primary face that acts as a centering aid for the mold core of the tool. The structure is favorably located on that region of the first primary face of the substrate that is positioned outside the tool at the time when the tool that incorporates the contour of the optical element is closed. It is particularly favorable for the centering aid to be located on the first primary face of the substrate in such a way that the centering aid fits flush around the tool that has the contour of the optical element.

According to a further embodiment of the method, the substrate has at least one sealing element on its first primary face.

The sealing element favorably surrounds that region of the first primary face to which the optical element is applied. It is particularly favorable for the sealing element here to take a closed form; in other words, for the sealing element to have no openings. The sealing element can, for instance, form a closed ring, something like an annulus, around the optical element. It is particularly favorable if the sealing element is laterally adjacent to the optical element. Particularly, the optical element and the sealing element may have a common boundary surface.

It is the task of the sealing element to seal off the cavity that incorporates the contour of the optical element when the tool is closed. The sealing element therefore favorably tightly closes against at least that part of the tool that incorporates the contour of the optical element. Particularly favorably, the sealing element closes tightly against that part of the tool that incorporates the contour of the optical element in such a way that no plastic material, or only a quantity of plastic material that is negligibly small for the function of the component, escapes from the cavity during the injection process.

It is particularly favorable if the sealing element compensates for shape and dimensional tolerances of the tool and/or the substrate.

The sealing element can, for instance, be formed as a lip.

According to one embodiment, the sealing element has a cross-section that is, at least in part, triangular, trapezoidal, or partially takes the form of an ellipse.

Furthermore, the sealing element favorably incorporates an elastic material. An elastic sealing element can advantageously be deformed when the tool closes, thereby creating a particularly good seal between the tool and the sealing element. In particular, the substrate incorporates a material that is hard in comparison with the sealing element, so that the substrate itself is not deformed when the tool closes.

An elastic sealing element can, for instance, incorporate at least one of the following materials, or can consist of at least one of the following materials: silicone, elastomeric plastic, lacquer, such as solder resist lacquer.

The sealing element is, for instance, glued or printed onto the first primary face of the substrate.

The sealing element can also, moreover, be partially embedded in the substrate. If the sealing element and the substrate are of different materials, the sealing element can, for instance, be worked into the substrate by means of multi-component injection molding. It is, moreover, also possible for the substrate to have a groove into which the sealing element is inserted.

An optoelectronic component that can, for example, be manufactured according to the method described here, incorporates in particular:
   a substrate having a first primary face and a second primary face that lies opposite the first primary face,
   a semiconductor body that is capable of transmitting electromagnetic radiation from a front side and that is arranged on the first primary face of the substrate, and
   a covering over the front side of the semiconductor body that is formed as an optical element and that is integrated into the optical component.

Favorably, the first and second primary faces are, at least in part, arranged on parallel planes. It is particularly favorable for parts of the two primary faces over which the optical element is attached to occupy parallel planes.

If the optoelectronic component incorporates a sealing element, it is particularly favorable for this to be located on that part of the primary face of the substrate that is parallel to the other face.

Because the radiation-generating semiconductor body of the optoelectronic component is mounted on a substrate that has two primary faces that face each other and that lie, in particular, partially in parallel planes, it is possible to use a closed cavity with the contour of the optical element in order to apply the covering, since the substrate with the semiconductor body is suitable for being placed in the cavity as an insert. A substrate that, for instance, in addition to a mounting surface for the semiconductor body, also incorporates further elements that are positioned at an angle with respect to the primary faces, such as, for instance, electrical connection parts, is not suitable for this purpose, since the cavity with the contour of the optical element cannot be closed.

In one embodiment of the optoelectronic component, a wavelength-converting layer is located between the front side of the semiconductor body and the covering.

In a further embodiment, the covering incorporates silicone or a hybrid material. In one development, the hybrid material includes 50% silicone and 50% epoxy resin. In another further development, the hybrid material contains between 10% and 70% (inclusive) epoxy resin.

In another embodiment of the optoelectronic component, a prefabricated housing, a prefabricated lead frame, a prefabricated lead frame with heat sink or a printed circuit board (PCB) is used as the substrate. In a further development, the substrate incorporates ceramic material and/or copper.

In a further embodiment, the semiconductor body is a thin-film semiconductor chip.

In a different embodiment of the optoelectronic component, a sealing layer is applied to the first primary face of the substrate. The sealing layer incorporates, for instance, dry resist. Alternatively, metallization may also be applied as a sealing layer. In one further development, the sealing layer is applied with a structure.

In a favorable embodiment of the optoelectronic component, the substrate has at least one raised region on its first primary face, favorably having the shape of a dome.

In one embodiment, the substrate incorporates a structure that acts as a centering aid for the mold core on its first primary face.

In another embodiment, the substrate has at least one sealing element on its first primary face. The sealing element surrounds, for instance, that region of the first primary face to which the optical element is applied. A cross-section of the sealing element is, for example, at least in part, triangular, trapezoidal, or takes the form of an ellipse. In a further development, the sealing element closes off the optical element laterally. Particularly, the sealing element and the optical element may have a common boundary surface. In one embodiment, the sealing element incorporates an elastic material. In another embodiment the sealing element is glued to the first primary face of the substrate, is printed onto it or is worked into it.

BRIEF DESCRIPTION OF THE DRAWINGS

Further features, favorable embodiments and advantageous properties of the invention will become clear in the example embodiments described below in association with FIGS. 1 to 15.

FIGS. 4A to 4D, show schematic sectional views of an arrangement in various stages of the process and according to one embodiment, FIG. 4E, shows a schematic sectional view of the arrangement during an alternative execution of the stage of the method according to FIG. 4B, FIG. 5, shows a schematic sectional view through an optoelectronic component according to one embodiment during one stage in carrying out the method, FIG. 7, shows a schematic sectional view through a further optoelectronic component according to one embodiment during one stage in carrying out the method, FIG. 8, shows a schematic sectional view through two optoelectronic components according to a further embodiment during one stage in carrying out the method, FIGS. 9, 10 and 11, show schematic sectional views through an optoelectronic component, each during one stage of executing the method according to one embodiment, FIGS. 13 to 15, show schematic sectional views through an optoelectronic component, each according to one embodiment.

In the examples of embodiment and the figures, elements that are identical or that have the same effect are given the same reference signs. The elements illustrated in the figures are not necessarily to be understood as being drawn to a correct scale. Individual components have, rather, been partially exaggerated or drawn larger for the sake of a better understanding.

DETAILED DESCRIPTION OF ILLUSTRATIVE EMBODIMENTS

Figure 1:
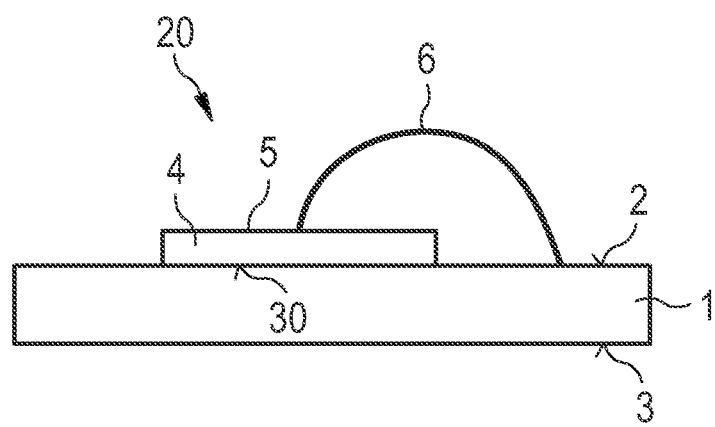
FIG. 1, shows a schematic sectional view through a substrate with an optoelectronic semiconductor body according to one embodiment.

The substrate 1 according to the embodiment of FIG. 1 includes a first primary face 2 and a second primary face 3, where a semiconductor body 4 that can generate radiation, such as a thin-film semiconductor chip, is mounted on the first primary face 2. The semiconductor body 4 has an electrically conductive connection here to a connecting point on the first primary face 2 of the substrate 1, in the present case using a bonding wire 6.

The substrate 1 can, for instance, consist of a preformed housing, a preformed lead frame, a preformed lead frame with heat sink, or a printed circuit board. The substrate 1 may, for instance, incorporate ceramic or copper, or may consist of these materials. Thus a ceramic tile, a copper sheet, or a laminated composite of these materials, such as a DBC substrate, can, for instance, be used as the substrate 1.

Moreover, a structured, metal lead frame having at least one opening for mechanical fixing in the tool may also be used as the substrate 1. A structured lead frame of this type favorably has tape on the second primary face 3 in order to avoid contamination with plastic material.

Figure 2:
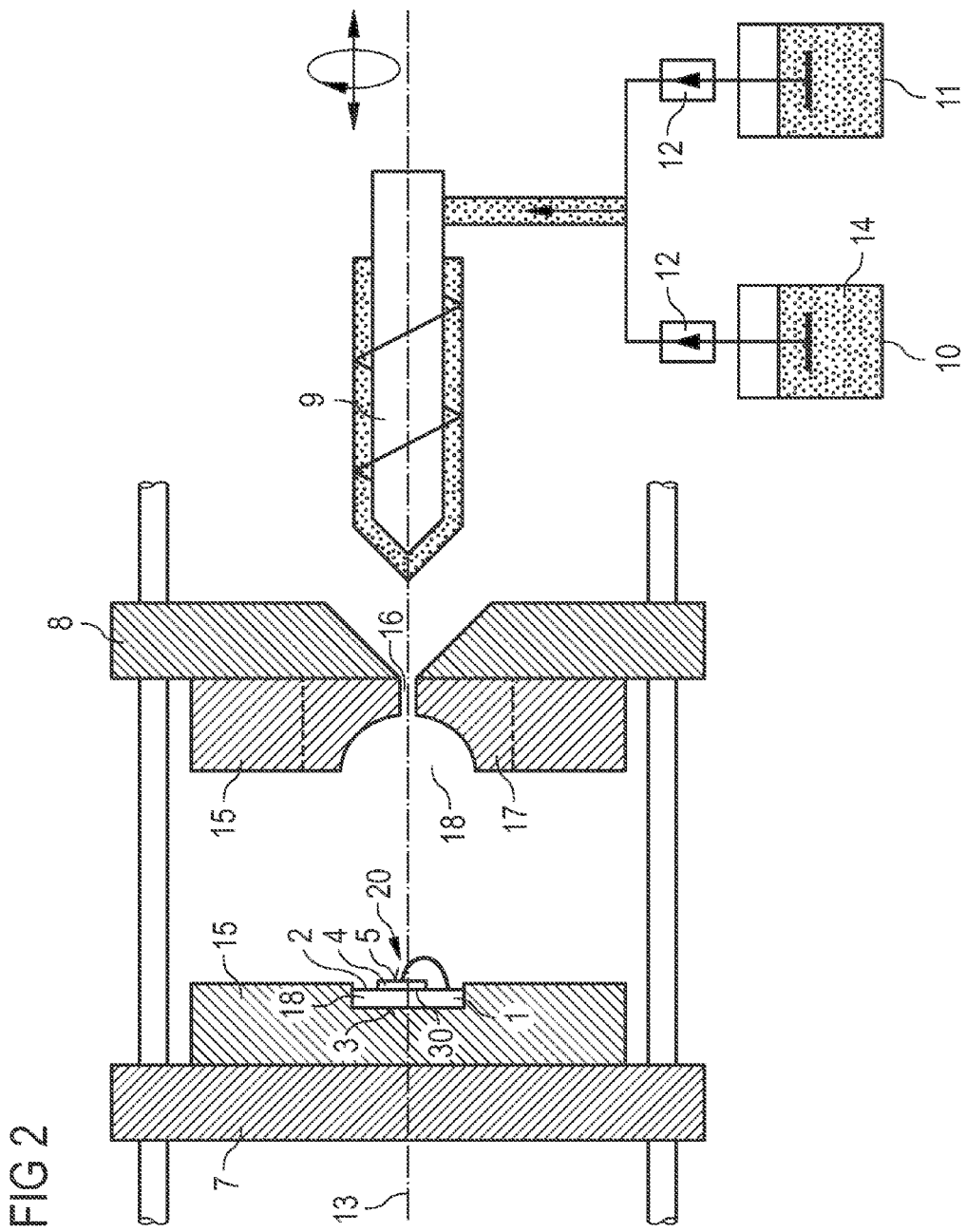
FIG. 2, shows a schematic sectional view of an arrangement during one process step according to one embodiment.

The arrangement according to the embodiment of FIG. 2 comprises two clamping plates 7, 8 and a proportioning system 9, in the present case a screw, as well as two containers 10, 11 each having a pump 12. The clamping plates 7, 8 are arranged parallel to one another. Furthermore, the clamping plates 7, 8 and the screw 9 are arranged along a common axis 13. The screw 9 can be moved along the axis 13, and can also be rotated around the axis 13 (see arrow in FIG. 2). The two containers 10, 11, are provided to hold a plastic material 14. This plastic material 14 can be transported out of either container 10, 11 with the aid of the pump 12 in the direction of the screw 9, as is suggested by the arrow on FIG. 2.

A piston proportioner can be used as the proportioning system 9 instead of a screw.

On each of the clamping plates 7, 8, part of the tool 15 is clamped in the arrangement according to FIG. 2. That part of the tool 15 that is clamped to the screw-side clamping plate incorporates a sprue system 16 as well as a mold core 17 having a cavity 18. The cavity 18 takes, in the present case, the form of a lens 19; in other words it has the same contour as the lens 19 (see, for example, FIG. 5).

A further clamping plate 7, on which a further part of the tool 15 is mounted, is positioned opposite the screw-side clamping plate 8. This part of the tool 15 incorporates a further cavity 18 into which the substrate 1 with the electrically contacted optoelectronic semiconductor body 4 according to FIG. 1 is placed as an insert 20.

In the present case the first primary face 2 and the second primary face 3 of the substrate 1 are located in planes parallel to one another. Furthermore, the radiation-emitting front side 5 of the semiconductor body 4, and the rear side 30 of the semiconductor body 4 that is opposite the front side are in planes parallel to one another, and also parallel to the first primary face 2 and the second primary face 3 of the substrate 1. The two clamping plates 7, 8 are, moreover, in planes that are parallel to the first primary face 2 and the second primary face 3 of the substrate 1, and therefore also in planes parallel to the front side 5 and the rear side 30 of the semiconductor body 4.

Figure 3:
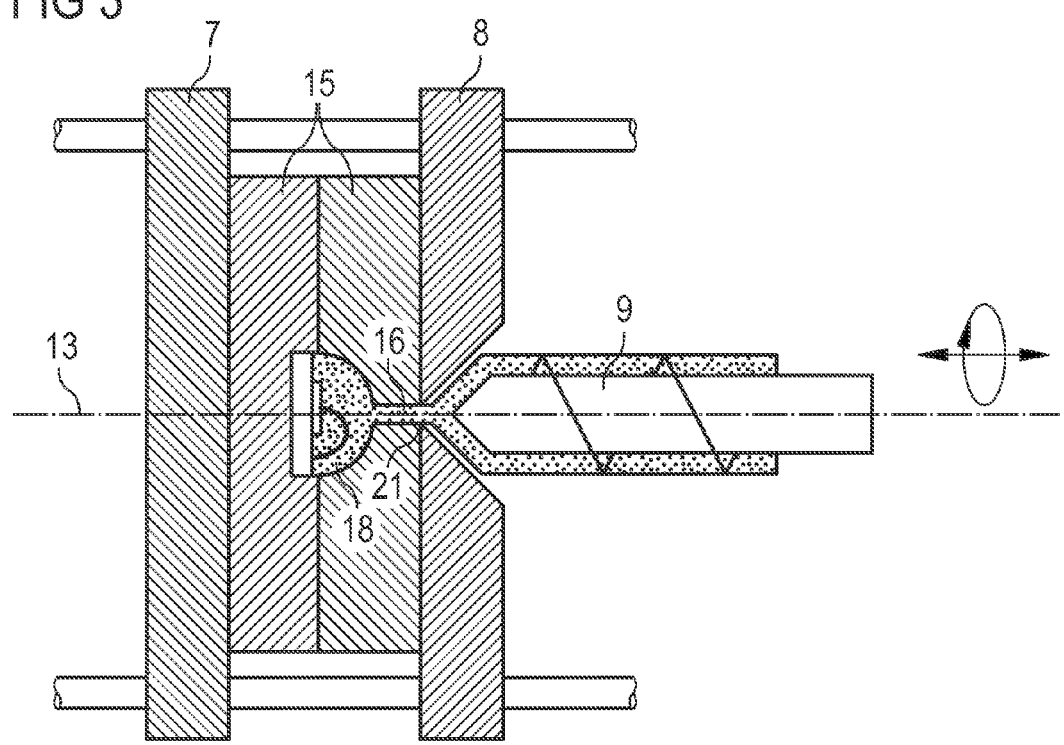
FIG. 3, shows a schematic sectional view of the arrangement according to FIG. 2 during a further process step.

In order to use a plastic processing method to apply a covering to the radiation-emitting front side 5 of the semiconductor body 4 in which the covering is implemented in the form of an optical element 19, the tool 15 is closed in such a way that the two parts of the tool touch each other, creating a common boundary surface at the side of the cavity 18, as is illustrated in FIG. 3. When closed, the cavity 18 of the tool 15 is located above the optoelectronic semiconductor body 4, where it forms a closed hollow space with the shape of an optical element 19, in the present case of a lens.

Alternatively it is also possible for that part of the tool 15 that has the cavity 18 that takes the form of the lens 19 to be implemented in such a way that the closed cavity 18 is formed together with the first primary face 2 of the substrate 1. In this case it is not necessarily essential that the two parts of the tool 15 make contact with one another and develop a common boundary surface. In this case, rather, the one part of the tool 15 makes contact with the first primary face 2 of the substrate 1, forming with this a common boundary surface.

When the tool 15 is closed, the screw 9 is moved along the axis 13 in the direction of the tool 15 to an injection point 21 of the sprue system 16. By rotating the screw 9, plastic material 14 is injected through the sprue system 16 into the closed cavity 18.

The plastic processing method of the embodiment according to FIGS. 2 and 3 is a liquid injection molding method. This plastic processing method advantageously allows the covering to be formed in a way appropriate for mass production, whereby the covering is simultaneously implemented as an optical element 19 that shapes the radiation characteristic of the optoelectronic component in the desired way. Cycle times between 20 and 300 seconds can be achieved with liquid injection molding.

A silicone, or a hybrid material that comprises silicone and epoxy resin, can, for instance, be used as the plastic material 14 for the covering. The hybrid material can comprise between 10% and 70% epoxy resin, 50% being a favorable proportion.

Because silicone and hybrid materials have a low viscosity when not hardened, typically between 1 and 100 Pa·s inclusive, effective closure of the cavity 18 is important in order to avoid contamination of the substrate surface to the side of the cavity 18 during the injection process. Contamination of this sort can lead to problems, particularly when electrical contact has to be made later with the optoelectronic component, and can require expensive additional assembly steps in the manufacture of the optoelectronic component.

In order to fill the cavity 18 better, and thereby generate more accurate shapes, the cavity 18 can be evacuated during the injection process. Ducts are provided in the tool for this purpose, connecting the cavity to a vacuum pump (not shown in the Figures).

Because the substrate 1 has two primary faces 2, 3 in planes that are parallel to one another, from which no further elements such as electrical contacting parts protrude, the substrate 1 with the semiconductor body 4 is particularly suitable for placement as an insert into the cavity 18 of a tool 15, as is shown in the embodiment of FIGS. 2 and 3. To the side of the two primary faces 2, 3, nevertheless, it is quite possible for elements, such as electrical contacting parts, to protrude.

The embodiment according to FIGS. 4A to 4D involves a method whereby, in contrast to the method according to FIGS. 2 and 3, compression molding is applied as the plastic processing method. Furthermore, FIGS. 4A to 4D illustrate the parallel manufacture of multiple optoelectronic semiconductor components.

As shown in FIG. 4A, a number of semiconductor bodies 4 are positioned on a first primary face 2 of a substrate 1, and electrical contact is made with each through a bonding wire 6. Then, as is shown in FIG. 4B, the substrate 1 is positioned on a part of a tool 15, for instance by placing it as an inserted part in a cavity 18 of the tool 15. Opposite the first part of the tool 15, and parallel to it, is a further part of the tool 15 that has a cavity 18 matching each semiconductor body 4, and having the inverse form or contour of a lens 19. A proportioning system 9 is positioned to the side of the tool 15, and this is able to transport plastic material 14 during an injection process when the tool 15 is open into the cavity 18. In the present case, the proportioning system 9 is a static-dynamic mixer, rather like a proportioner with a mixing piece. As an alternative, however, a screw may also be used.

After introducing the plastic material 14 into the cavity 18, the two halves of the tool 15 are closed, as is shown schematically in FIG. 4C by an arrow. When the tool 15 is closed, the plastic material 14 fills the cavity 18, creating a covering that has the form of the optical element 19 over the front side of each of the semiconductor bodies 4, as is indicated in FIG. 4D.

As in the embodiment according to FIGS. 1, 2 and 3, the substrate 1 in the embodiment according to FIGS. 4A to 4D can consist of a preformed housing, a preformed lead frame, a preformed lead frame with a heat sink, a DBC substrate, or a printed circuit board. The substrate 1 may, for instance, incorporate copper or ceramic, or may consist of these materials.

The plastic material 14 can, in the embodiment according to FIGS. 4A to 4D, be the same material as is used in the embodiment according to FIGS. 1, 2 and 3.

As is illustrated in FIG. 4E, a foil 28 can be inserted between the cavity 18 and the substrate 1 into the open tool 15 prior to injecting the plastic material 14 through the proportioning system 9. In the present case the foil 28 is located in such a way that when the tool 15 is closed it is directly adjacent to the cavities 18, and therefore results in improved shaping by the cavities 18. The foil 28 prevents the plastic material 14 from coming into contact with the wall of the tool and adhering to it in an unwanted way. In order to move the foil 28 in the direction of the tool wall, it is possible, for instance, to utilize a vacuum that pulls the foil 28 in the direction of the tool wall.

Furthermore, when the tool 15 is closed, the foil 28 comes to be located between the substrate 1 and that part of the tool 15 that incorporates the cavity 18 that has the contour of the optical element. One side of the foil 28 is thus directly in contact with the substrate 1, which means that it forms a common boundary surface with the substrate 1. On the other side, the foil 28 is directly in contact with the tool 15, which means that it forms a common boundary surface with the tool 15. In this way, the foil 28 can compensate for unevenness in the substrate 1 and also in the tool 15, as a result of which at least the quantity of plastic material 14 that can escape from the cavity 18 onto the substrate 1 is advantageously reduced.

After the covering has been formed, the tool 15 is opened again, and the foil 28 removed.

Because the tool 15 is usually heated, a temperature-resistant foil 28 is favorably used; particularly favorably it is resistant to temperatures between 100° C. and 150° C. inclusive.

The foil 28 is favorably between 20 μm and 100 μm thick, inclusive. The foil 28 can, for instance, incorporate ethylene tetrafluoroethylene (ETFE), or consist of this material.

A sealing layer 22 (see, for example, FIG. 5) can also be applied to the substrate 1 as an alternative to or in addition to the foil 28. Favorably, a sealing layer 22 of this sort is used in association with the tool whose material does not involve adhesion with the plastic material. The tool can, for instance, be coated for this purpose.

Figure 5:
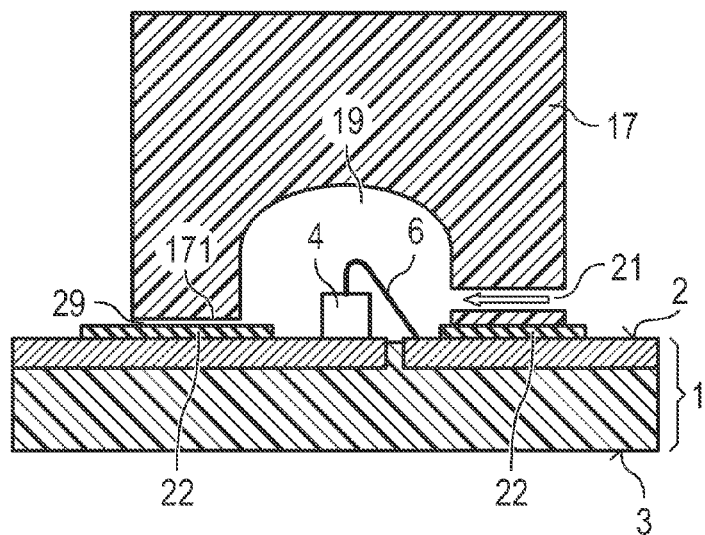

The optoelectronic component according to the embodiment of FIG. 5 includes a preformed lead frame with a heat sink as the substrate 1. An optoelectronic semiconductor body 4 capable of generating radiation is mounted on the first primary face 2 of the substrate 1. Electrical contact is made to the optoelectronic semiconductor body 4 by means of a bonding wire 6. A sealing layer 22 is applied to the first primary face 2 of the substrate 1 at the side of the semiconductor body 4, with the purpose of compensating for unevenness in the substrate 1.

The optoelectronic component according to the embodiment of FIG. 5 also incorporates a covering around the semiconductor body over the front side, implemented in the form of an optical element 19, in this case a lens, and which is transparent for the electromagnetic radiation from the semiconductor body 4.

The covering of the semiconductor body 4 is fabricated using a plastic processing method, in this case liquid injection molding, as has already been described in association with FIGS. 1 to 3.

FIG. 5, furthermore, illustrates a mold core 17 of a tool 15, having a cavity 18 with the contour of a lens, as has already been described above. The mold core 17 has an injection point 21 to the side, through which the plastic material 14 can be introduced into the cavity 18 during the injection process. In order to avoid contamination of the substrate 1 outside the covering during the injection process, a sealing layer 22 is applied to the first primary face 2 of the substrate 1 in the embodiment of FIG. 5. The sealing layer 22 is particularly applied in the region of the substrate 1 on which the mold core 17 is placed when the tool 15 is closed. The sealing layer 22 here has the task of compensating for unevenness in the substrate, as is present in particular on ceramic substrates.

The sealing layer 22 incorporates, for instance, a dry resist, or consists of this material. The sealing layer 22 can, for instance, be applied by means of a printing procedure such as screen printing, pad printing or an inkjet method. Metallization, or a foil, can furthermore be applied to the first primary face 2 of the substrate 1 as a sealing layer 22. The sealing layer 22 can, moreover, be applied with a structure, for instance having ducts for venting the cavity during the injection process. The sealing layer 22 and the optical element 19 favorably have a common boundary surface.

Furthermore, in the embodiment according to FIG. 5, a surface 171 of the mold core 17 of the tool 15 incorporates a recess on the side opposite the injection point 21 and facing the sealing layer 22, so that the recess and the sealing layer 22 create a venting duct 29. In other words, the surface 171 of the mold core 17 is set back in such a way that, together with the sealing layer 22, it forms a venting duct 29.

The cavity 18 can be vented through the venting duct 29 during the injection process. This allows the lens contour to be shaped more accurately.

Figure 6:
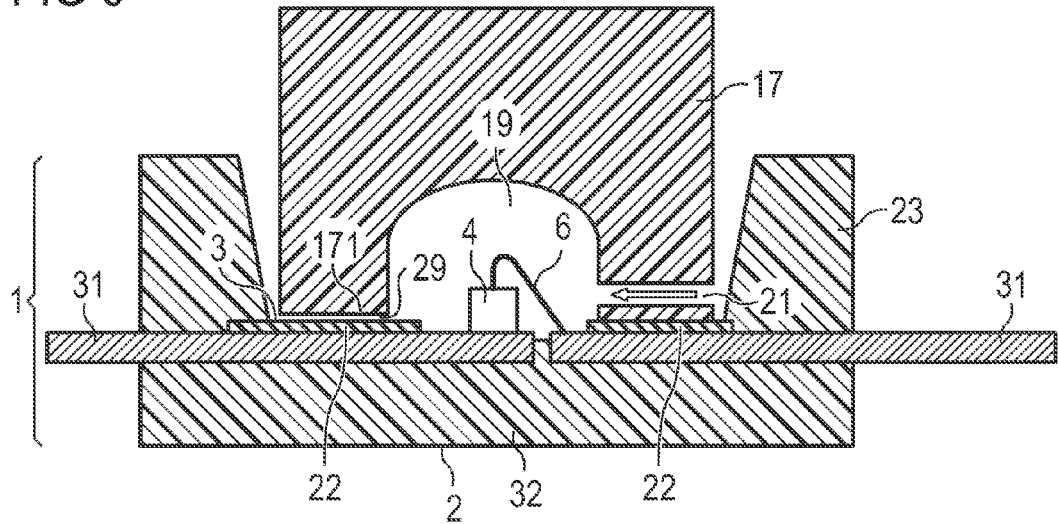
FIG. 6, shows a schematic sectional view through a further optoelectronic component according to one embodiment during one stage in carrying out the method.

The optoelectronic component according to the embodiment of FIG. 6 is the same as the optoelectronic component in the embodiment of FIG. 5 apart from the substrate 1. In the embodiment of FIG. 6, the substrate 1 incorporates a structure 23 at the side, in the present case an inclined slope, that can, for instance, surround the semiconductor body 4 that serves as a centering aid for the mold core 17 during the injection molding process. For this purpose, the structure 23 is advantageously positioned on the substrate 1 in such a way that it surrounds the mold core 17 when the tool 15 is closed. Furthermore, the substrate 1 according to the embodiment of FIG. 6 incorporates two connecting strips 31 that protrude to the side out of the body of the housing 32. The connecting strips 31 are in a plane that is parallel to the second primary face 3 of the substrate 1. Moreover, that part of the first primary face 2 that is located within the centering aid and on which the semiconductor 4 and the sealing layer 22 are located, is in a plane parallel to the second primary face 3.

The body of the housing 32 can, for instance, incorporate at least one of the following thermoplastic materials, or can consist of at least one of the following thermoplastic materials: polyphthalamide (PPA), liquid-crystal polymers (LCP), polyaryletheretherketone (PEEK).

The optoelectronic component according to the embodiment of FIG. 7 also differs from the optoelectronic component according to FIGS. 5 and 6 primarily in the implementation of the substrate 1. In the present case, a base plate, consisting, for example, of ceramic, with metallization as a sealing layer 22, is used as the substrate 1. Furthermore the first primary face 2 of the substrate 1 incorporates a surrounding, dome-shaped raised region 24 adjacent to the sealing layer 22, which protrudes into the covering and anchors it more effectively to the substrate 1. The anchoring can, for instance, be generated by increasing the contact area between the covering and the substrate as a result of the dome-shaped raised region 24, or may be caused by undercutting the dome-shaped raised region 24 to the outside or the inside. As an alternative to a surrounding dome-shaped raised region 24, single or multiple separate dome-shaped raised areas on the first primary face 2 of the substrate 1 can also be used.

FIG. 8 illustrates an embodiment of a method in which a roll-to-roll process handles multiple associated substrates 1 at the same time, in the present case, two substrates 1 are shown as an example. Lead frames attached to a roll can, for example, be used as the substrate 1. An optoelectronic semiconductor body 4 to which electrical contact is made through a bonding wire 6 is attached to each of the first primary faces 2 of the substrate 1. To the side of the semiconductor body 4, the substrate 1 has a sealing layer 22 on its first primary face 2, as has already been described with the aid of FIGS. 5 to 7. The sealing layer 22 is here located on those parts of the first primary face 2 that are aligned parallel to the second primary face 3. In order to protect the optoelectronic semiconductor body 4 a placeholder for the semiconductor body can, optionally, be arranged, although it is not illustrated on FIG. 8 for reasons of clarity. Above the substrate 1, FIG. 8 also shows a mold core 17 having two cavities 18, having the contour of the lens and located above the semiconductor bodies 4. The cavities 18 are connected by ducts through which the plastic material 14 can penetrate. The mold core 17 is, furthermore, laterally recessed in order to allow the cavities 18 to be vented.

A wavelength-converting layer 25 is, moreover, applied to each of the radiating front sides 5 of the optoelectronic semiconductor bodies 4 in the embodiment according to FIG. 8. In the present case, the wavelength-converting layer 25 incorporates particles of a wavelength-converting material 26 embedded in a binding agent 27. One of the materials that have already been described in the general description can, for instance, be used as the wavelength-converting material 26. In the same way, one of the materials mentioned in the general description may be suitable as the binding agent 27.

In order to manufacture multiple optoelectronic components at the same time, it is, furthermore, possible to attach multiple optoelectronic semiconductor bodies 4 to a substrate 1 or to multiple, connected, substrates 1, and then to apply a covering to each of the front sides of the semiconductor bodies 4, where the covering is implemented in the form of an optical element 19 using a closed cavity 18 that has the same contour as the optical element 19. A plastic processing method such as LIM or compression molding, as has already been described above, can be used for this purpose. In contrast to the embodiments described above, however, a tool 15 is used that incorporates multiple cavities 18, each having the contour of the optical element 19. After the covering has been applied, the individual optoelectronic components are separated, for instance by sawing.

In the method according to the embodiment of FIGS. 9, 10 and 11, the substrate 1 is implemented as a preformed housing. The preformed housing incorporates a housing body 32 that incorporates the plastic, as well as two electrical contact strips 31 that are part of a lead frame. The housing body 32 has a first primary face 2 and a second primary face 3, where the second primary face 3 is on the opposite side to the first primary face 2. The housing body 32 includes, furthermore, a recess 33 on its first primary face 2, into which the semiconductor body 4 is mounted. Those parts of the first primary face 2 that are located to the side of the recess 33 here occupy a plane that is parallel to the second primary face 3. The electrical connecting strips 31 are also in a plane that is parallel to the second primary face 3.

The two connecting strips 31 are included in the housing body 32 in such a way that in each case one part of the surface of each connecting strip 31 forms a part of the surface of the recess 33.

The semiconductor body 4 is mounted in the recess 33 in such a way that an electrically conductive connection is created between its rear side 30 and one of the connecting strips 31. This can, for instance, be implemented by means of an electrically conductive adhesive. A bond wire 34 on the front side 5 of the semiconductor body 4 provides an electrically conductive connection to the other connecting strip 31.

A sealing element 35 is, moreover, attached to those areas of the primary face 2 of the housing body 32 that occupy a plane parallel to the second primary face 3. The sealing element 35 is located in the present case in such a way, fully surrounding the recess 33, that the sealing element 35 creates a closed ring surrounding the recess 33. In the embodiment according to FIGS. 9, 10 and 11, the sealing element 35 moreover incorporates an elastic material and has a cross-section having the shape of a triangle.

As shown in FIG. 10, the substrate 1, together with the semiconductor body 4 mounted into the recess 33, is inserted into one part of the tool 15. A further part of the tool 15 incorporates the cavity 18 that has the contour of the optical element 19, according to which the covering will be shaped. When the tool 15 is closed, that part of the tool 15 that has the contour of the optical element 19 is placed onto the second primary face 3 that is in a plane parallel to the first primary face 2 of the substrate 1 in such a way that the contour of the optical element 19 creates a closed cavity 18 over the semiconductor body 4. The sealing element 35 in the cavity 18 of the tool 15 that has the contour of the optical element 19, are in this way arranged in such a way that the contour of the optical element 19 that is to be manufactured is laterally adjacent to the sealing element 35.

In a further step in the method, illustrated schematically in FIG. 11, closing pressure is now applied to the tool 15, so that the sealing element 35 is deformed and laterally seals the cavity 18. With the aid of controlled surface pressure, it is possible in most cases to reduce the closing pressure, and thereby to exert reduced forces on the component. It is now possible to fill the cavity 18 with the plastic material 14, silicone for instance. The sealing element 35 hereby at least reduces the quantity of plastic material 14 that gets on to the first primary face 2 of the substrate 1.

Figure 12A:
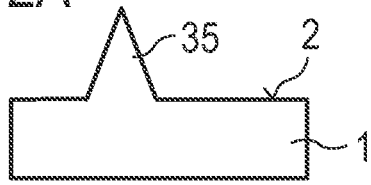
FIGS. 12A to 12E, show schematic sectional views through a sealing element, each according to one embodiment.
Figure 12B:
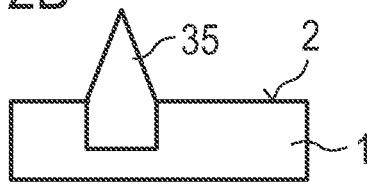
Figure 12C:
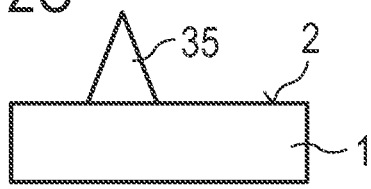

The sealing elements 35 according to the embodiments in FIGS. 12A to 12E are applied to the first primary face 2 of the substrate 1; the sealing elements 35 according to the embodiments in FIGS. 12A to 12C have a cross-section that is implemented in the form of a triangle.

The sealing element 35 according to the embodiment in FIG. 12A is made of the same material as the substrate 1, and is integrated into the substrate 1. The sealing element 35 is manufactured in this case together with the substrate 1, for instance using an injection molding method.

The sealing element 35 according to the embodiment of FIG. 12B incorporates a material that is different from the material of the substrate 1. Furthermore, the sealing element 35 is partially embedded in the substrate 1. If the substrate 1 is manufactured using an injection molding method, the substrate 1 and the sealing element 35 can be made using, for instance, a multi-component injection molding method. It is alternatively also possible for the substrate 1 to incorporate a groove into which a separately manufactured sealing element 35 is inserted.

The sealing element 35 according to the embodiment of FIG. 12C incorporates, like the sealing element 35 according to the embodiment in FIG. 12B, a material that is different from the material of the substrate 1. In the present case the sealing element 35 is attached to the first primary face 2 of the substrate 1, for instance by gluing or printing.

Figure 12D:
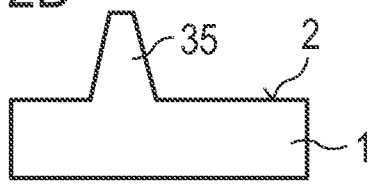

The sealing element 35 according to the embodiment shown in FIG. 12D is, in contrast to the sealing element 35 according to the embodiment shown in FIGS. 12A to 12C, implemented as a surrounding ring having a trapezoidal cross-section. Like the sealing element 35 according to the embodiment shown in FIG. 12A, it is integrated into the substrate 1, for instance by means of injection molding.

Figure 12E:
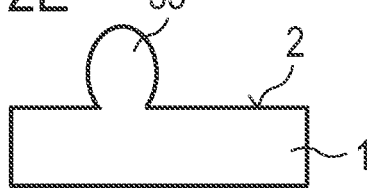

The sealing element 35 according to the embodiment shown in FIG. 12E has, in contrast to the sealing element 35 according to the embodiment shown in FIGS. 12A to 12C, a cross-section that in part has a form similar to an ellipse. Like the sealing elements 35 according to the embodiment shown in FIGS. 12A and 12D, it is integrated into the substrate 1, for instance by means of injection molding.

The sealing elements 35 according to the embodiment shown in FIGS. 12A to 12E, favorably have a height between 0.05 mm and 0.5 mm inclusive.

The sealing element 35 is manufactured, for instance, from the same material as the body of the housing 32. The sealing element 35 consists, for example, of one of the following thermoplastic materials, or at least incorporates one of the following thermoplastic materials: PPA, LCP, PEEK.

The sealing element 35 can, moreover, be made of an elastic or ductile material, whereas the substrate is made of a rigid material. The substrate, for instance the housing body 32, incorporates here, for instance, one of the thermoplastic materials described above, whereas the sealing element 35, for instance, incorporates a silicone material, an elastomeric plastic, or a lacquer, such as solder resist lacquer.

The optoelectronic component according to the embodiment of FIG. 13 is, for instance, manufactured using the steps of the method as have already been explained with reference to FIGS. 9 to 11. It therefore exhibits those features of the optoelectronic component that have already been described with reference to FIGS. 9 to 11.

The electrical connection strips 31 of the component according to the embodiment of FIG. 13 are bent in the direction of the second primary face 3 of the substrate 1.

The optical element 19 in the optoelectronic component according to FIG. 13 incorporates a silicone material, and is implemented in the shape of a lens 19. The lens 19 has a lens footing 36 that lies at the side against the sealing element 35. The sealing element 35 has, in the present case, a trapezoidal cross-section, as has already been explained with reference to FIG. 12D. Because the lens footing 36 is laterally adjacent to the sealing element 35, which in the present case is made of a light-absorbing material, it is favorably possible to reduce unwanted stray light emerging from the lens footing 36. The sealing element 35 incorporates, for example, one of the following materials, or consists of one of the following materials: PPA, LCP, colored customers, colored silicone.

The optoelectronic component according to the embodiment of FIG. 14 incorporates, in contrast to the optoelectronic component according to the embodiment of FIG. 13, a circuit board as a substrate 1. A metal-cored circuit board can, for instance, be used as the circuit board. The circuit board can, moreover, incorporate a ceramic or glass-fiber reinforced epoxy resin. The circuit board can, for instance, incorporate one of the following materials commonly found in the electronic industry: FR4, FR5, BT.

The circuit board has metallization 37 on its first primary face 2, extending over the side surfaces of the circuit board 1 and, partially, over the second primary face 3 of the circuit board.

The semiconductor body 4 is mounted on the metallization 37 on the first primary face 2 of the circuit board 1 in such a way that an electrically conductive connection is formed between the rear 30 of the semiconductor body 4 and the metallization 37. The front face 5 of the semiconductor body 4 has an electrically conductive connection to a further part of the metallization 37, where the metallization 37 has a structure such that a short circuit is avoided.

The sealing element 35 is, in the present case, fabricated in direct contact with the metallization 37 of the circuit board 1 surrounding the semiconductor body 4. The sealing element 35 can, for instance, be printed onto the metallization 37, or glued to it. The metallization 37, furthermore, creates external connecting points 38 to the side of the sealing element 35, provided in order to make external contact with the optoelectronic component.

The other elements and features of the optoelectronic component according to the embodiment shown in FIG. 14, in particular the lens 19 and the lens footing 36, can, for instance, be implemented according to the embodiment illustrated in FIG. 13. To avoid repetition, they are therefore not described in detail.

The optoelectronic component according to the embodiment of FIG. 15 also differs from the optoelectronic component according to FIG. 13 primarily in the substrate 1. The other elements and features of the optoelectronic components according to FIG. 15 can, for instance, be implemented as has already been described with reference to FIG. 13 or to FIGS. 9 to 11.

The substrate 1 of the optoelectronic component according to FIG. 15 incorporates, like the optoelectronic component according to the embodiment shown in FIG. 13, a preformed housing body 32, through which an electrically conductive strip 39 passes that, at least in part, creates the surface of the recess 33 of the housing body 32 into which the semiconductor body 4 is fitted. In contrast to the substrate 1 according to the embodiment shown in FIG. 13, however, the electrically conductive strips 39 do not form two connecting strips at the side of the housing body 32. The electrically conductive strips 39 to the side of the housing body 32 are rather implemented as external connecting points 38, for instance as solder contacts, which in the present case has a surface in a plane that is parallel to the second primary face 3 of the housing body 32.

The other elements and features of the optoelectronic component according to the embodiment shown in FIG. 15, in particular the lens 19, the lens footing 36 and the sealing element 35, can, for instance, also be implemented according to the embodiment illustrated in FIG. 13. To avoid repetition, they are therefore not described in detail.

The invention is not restricted to the description that refers to the example embodiments. The invention, rather, comprises every new feature and every combination of features, and, in particular, any combination of features in the patent claims, even if this feature or this combination of features is not itself explicitly described in the patent claims or in the example embodiments.

The invention claimed is:

1. A method for the manufacture of an optoelectronic component, the method comprising:
   providing a substrate having a first primary face and a second primary face that lies opposite the first primary face,
   attaching a semiconductor body to the first primary face of the substrate the semiconductor body capable of emitting electromagnetic radiation from a front side, and
   forming a covering that is permeable to radiation from the semiconductor body to at least the front side of the semiconductor body, wherein the covering is given the form of an optical element by using a tool having a closed cavity shaped with a contour of the optical element
   wherein the substrate has at least one sealing element on its first primary face, the sealing element surrounding an area of the first primary face onto which the optical element is applied and laterally adjoining to a side of the optical element.

2. The method according to claim 1, wherein the covering is formed by means of a plastic processing method.

3. The method according to claim 2, wherein a foil is placed into the tool.

4. The method according to claim 2, wherein the plastic processing method comprises liquid injection molding (LIM).

5. The method according to claim 2, wherein the plastic processing method comprises liquid transfer molding.

6. The method according to claim 2, wherein the plastic processing method comprises compression molding.

7. The method according to claim 1, wherein the covering comprises a plastic material.

8. The method according to claim 7, wherein the covering comprises silicone.

9. The method according to claim 7, wherein the covering comprises a hybrid material.

10. The method according to claim 1, wherein the substrate comprises a preformed housing, a preformed lead frame without a heat sink, a preformed lead frame with a heat sink or a printed circuit board.

11. The method according to claim 1, further comprising applying a sealing layer to the first primary face of the substrate.

12. The method according to claim 11, wherein a mold core of the tool incorporates a venting duct and/or a surface of the mold core of the tool is recessed in such a way that this, together with a surface of the sealing layer forms the venting duct.

13. The method according to claim 1, wherein a mold core of the tool incorporates a venting duct and/or a surface of the mold core of the tool is recessed in such a way that said surface, together with a surface of the substrate forms the venting duct.

14. The method according to claim 1, further comprising evacuating the closed cavity prior to an injection process.

15. The method according to claim 1, wherein a plurality of semiconductor bodies each of which is capable of generating electromagnetic radiation are attached from a front side to the first primary face of the substrate, the method further comprising:
   forming the covering comprises forming the covering over the front sides of the plurality of semiconductor bodies,
   the method further comprising separating the substrate into individual components after the covering has been applied.

16. The method according to claim 1, wherein the substrate has at least one raised region on its first primary face.

17. The method according to claim 16, wherein the at least one raised region has a shape of a dome.

18. The method according to claim 1, wherein the substrate has a structure on its first primary face that acts as a centering aid for a mold core.

19. The method according to claim 1, wherein the at least one sealing element has a cross-section that is, at least in part, triangular, trapezoidal or elliptical.

20. The method according to claim 1, wherein the at least one sealing element incorporates an elastic material.

\* \* \* \* \*

UNITED STATES PATENT AND TRADEMARK OFFICE
CERTIFICATE OF CORRECTION

PATENT NO. : 8,435,806 B2  
APPLICATION NO. : 12/595887  
DATED : May 7, 2013  
INVENTOR(S) : Jaeger et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 605 days.

Signed and Sealed this
Eighth Day of September, 2015

Michelle K. Lee
*Director of the United States Patent and Trademark Office*